United States Patent
Yoshida et al.

(10) Patent No.: US 6,775,141 B2
(45) Date of Patent: Aug. 10, 2004

(54) HEAT DISSIPATION STRUCTURE FOR USE IN COMBINATION WITH ELECTRONIC CIRCUIT BOARD

(75) Inventors: Ryuji Yoshida, Tokyo (JP); Masato Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/368,399

(22) Filed: Feb. 20, 2003

(65) Prior Publication Data

US 2003/0161111 A1 Aug. 28, 2003

(30) Foreign Application Priority Data

Feb. 20, 2002 (JP) ........................................ 2002-044002

(51) Int. Cl.⁷ .......................... H05K 07/20; H01L 23/34
(52) U.S. Cl. ........................ 361/719; 361/717; 257/713; 257/707
(58) Field of Search ................................ 361/717–719, 361/609, 702, 704, 705, 722, 727; 165/80.3, 185; 257/705–707, 713, 717–719

(56) References Cited

U.S. PATENT DOCUMENTS 5,109,318 A * 4/1992 Funari et al. ............... 361/710
5,373,418 A * 12/1994 Hayasi ........................ 361/707
5,375,040 A * 12/1994 Cooper et al. ............... 361/730
5,514,917 A * 5/1996 Rudy, Jr. et al. ............ 307/104

FOREIGN PATENT DOCUMENTS

| JP | A-10-84063 | 3/1998 |
| JP | A 2001-257306 | 9/2001 |

* cited by examiner

*Primary Examiner*—Anatoly Vortman
(74) *Attorney, Agent, or Firm*—Oliff & Berridge PLC

(57) ABSTRACT

To provide a heat dissipation structure for an electronic circuit board, a recessed portion is formed in a surface of a heat dissipation board to extend to at least one side surface thereof. A gel-like resin having a high thermal conductivity is coated over the recessed portion. The electronic circuit board is brought into facial contact with the heat dissipation board with the electrical insulation sheet interposed therebetween so that at least one electronic component is buried in the gel-like resin. The gel-like resin coated in the recessed portion is such an amount that a gap between the electronic component and side surfaces and bottom surface of the recessed portion is filled with the gel-like resin and an excess amount of the gel-like resin is expelled out of the side surface of the heat dissipation board The gel-like resin protruded from the side surfaces of the heat dissipation board is removed.

20 Claims, 5 Drawing Sheets

HEAT DISSIPATION STRUCTURE FOR USE IN COMBINATION WITH ELECTRONIC CIRCUIT BOARD

BACKGROUND OF THE INVENTION

1. Field of the Invention

The present invention relates generally to a heat dissipation structure for use in combination with an electronic circuit board. The invention relates further to a method of producing an electronic circuit board assembly including a heat dissipation board.

2. Description of the Prior Art

Heat dissipation boards have been extensively used for electronic circuit boards on which heat generating electronic components are mounted. Japanese Patent Application Publication No. 10-84063, for example, discloses a heat dissipation structure as shown in FIG. 1. As shown therein, a heat dissipation board 33 is in an inversed U-shaped configuration in cross-sectional view with heat dissipation fins 33a formed on the top surface thereof. An electronic circuit board 32 is fixed to the lower face of the heat dissipation board 33 to form a space 33b in which heat generating electronic components 31 are accommodated. Other electronic components 34 are mounted on the reverse side of the electronic circuit board 32.

A molten resin 35 is injected into the space 33b from a resin injection port 33c formed in the side surface of the heat dissipation board 33 to mold the electronic components 1. Air discharge port 33d is formed in the opposing side surface of the heat dissipation board 33 to ease the injection of the molten resin. With this structure, molding the heat generating electronic components with the resin improves heat dissipation efficiency.

SUMMARY OF THE INVENTION

The present invention provides a new heat dissipation structure that has excellent heat dissipation capability. The present invention also provides a manufacturing method for manufacturing an electronic circuit board assembly having the heat dissipation structure.

An electronic circuit board assembly according to the present invention includes an electronic circuit board on which a plurality of electronic components are mounted, an electrical insulation sheet, and a heat dissipation board in facial contact with the electronic circuit board with the electrical insulation sheet interposed therebetween. The heat dissipation board is formed with at least one recessed portion on a top surface facing the electronic circuit board and having side surfaces connecting to the top surface. A heat dissipation material, such as a gel-like resin, is coated over the recessed portion and at least one electronic component from the plurality of electronic components is accommodated in the recessed portion over which the heat dissipation material is coated. An amount of the dissipation material is such that the heat dissipation material fills a gap between the electronic component and the side walls and the bottom wall of the recessed portion.

With the electronic circuit board assembly thus constructed, the heat dissipation board dissipates heat through the heat dissipation material and also from a side surface of the electronic component, thereby improving the heat radiability. Moreover, in the case where the electronic component is a semiconductor device, the heat of the high-temperature terminal is radiated through the resin as well as through the wiring pattern on the circuit board and the insulating sheet between the circuit board and the heat dissipation board, whereby the heat in radiated with high efficiency.

For the heat dissipation board formed with a plurality of recessed portions on the top surface thereof, at least two recess portions may have different depths. In this case, the depth of the recessed portion is determined depending on a height of the electronic component to be accommodated.

A through-hole and/or a notch may be formed in the electronic circuit board to allow the heat dissipation material to escape from the recessed portion when the electrical component is intruded into the recessed portion. With the through-hole or notch formed, air bubbles can be prevented from being generated between the electronic circuit board and the recessed portion, thereby being capable of improving the heat radiability Further, the recessed portion formed in the heat dissipation board may extend to at least one of the side surfaces of the heat dissipation board. In this case, the heat dissipation material is filled over an area covering the one of the side surfaces of the heat dissipation board. By doing so, the electronic component can be mounted in alignment with the side surface of the heat dissipation board, so that a space for accommodating the electronic components is enlarged enough to increase a degree of freedom of mounting the electronic components, thereby attaining a higher density of mounting the electronic component on the printed-circuit board.

According to another aspect of the present invention, there is provided a method of manufacturing an electronic circuit board assembly includes forming a recessed portion in the top surface of the heat dissipation board to extend to at least one of the side surfaces, coating the recessed portion with a gel-like resin having heat dissipation capability, bringing the electronic circuit board into facial contact with the heat dissipation board with the electrical insulation sheet interposed therebetween so that at least one electronic component from the plurality of electronic components mounted on the electronic circuit board is buried in the gel-like resin. The gel-like resin coated in the recessed portion is such an amount that a gap between the electronic component and side surfaces and bottom surface of the recessed portion is filled with the gel-like resin and an excess amount of the gel-like resin is expelled out of the one of the side surfaces of the heat dissipation board. Finally, the gel-like resin protruded from the side surface of the heat dissipation board is removed.

Thus, the gel-like resin is partially made to swell out of the opening of the recessed portion on the side surface of the heat dissipation board by intruding the electronic component into the resin to be removed. Therefore, the electronic component can be intruded in a state where the recessed portion is sufficiently filled with the resin, and the air bubbles is prevented from being generated, thereby being capable of ensuring the thermal conductivity in the resin. Further, the space for accommodating the electronic component is enlarged enough to increase the degree of freedom of mounting the electronic component, thereby attaining a higher density of mounting the electronic components on the printed-circuit board.

DETAILED DESCRIPTION OF THE PREFERRED EMBODIMENT

Figure 1:
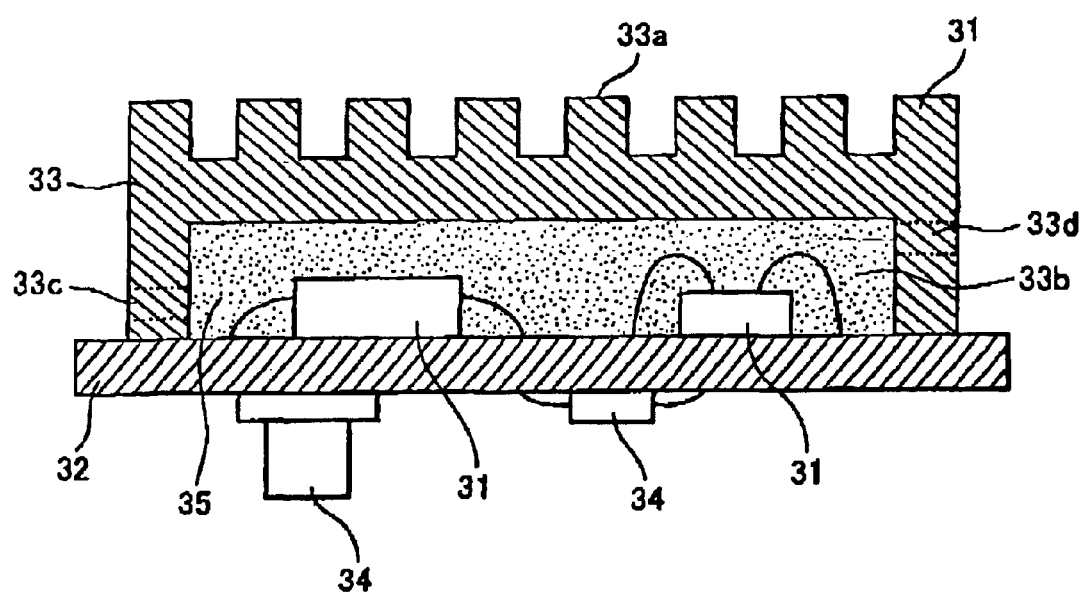
FIG. 1 is a cross-sectional view showing a conventional electronic circuit board assembly.
Figure 2A:
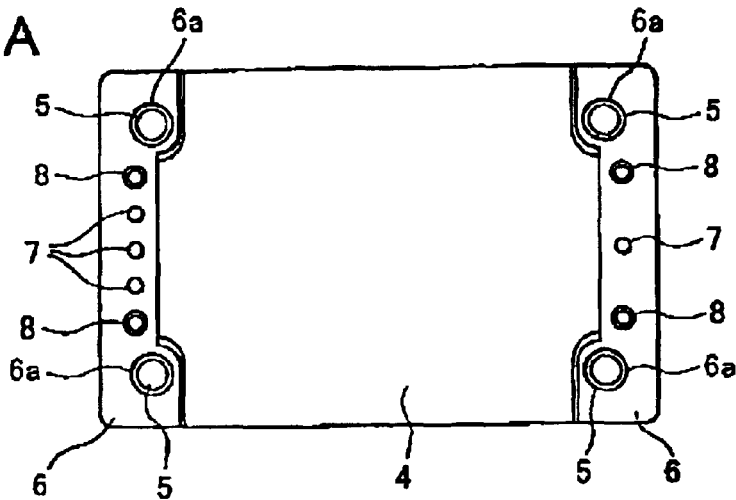
FIG. 2A is a plan view showing an electronic circuit board assembly with a heat dissipation capability according to an embodiment of the present invention.
Figure 2B:
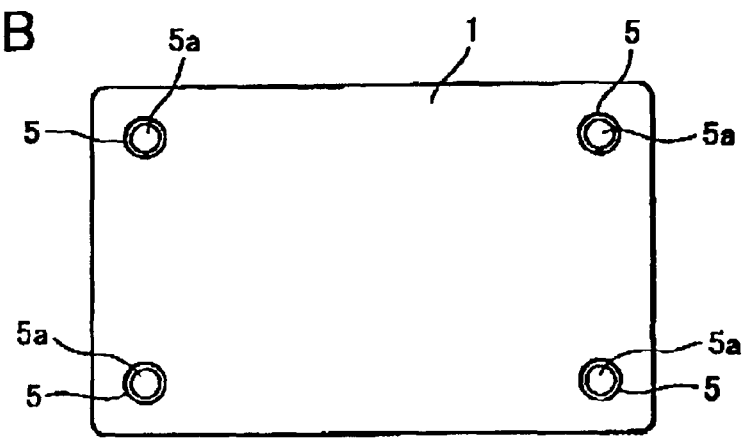
FIG. 2B is a bottom view of the electronic circuit board assembly shown in FIG. 2A.
Figure 2C:
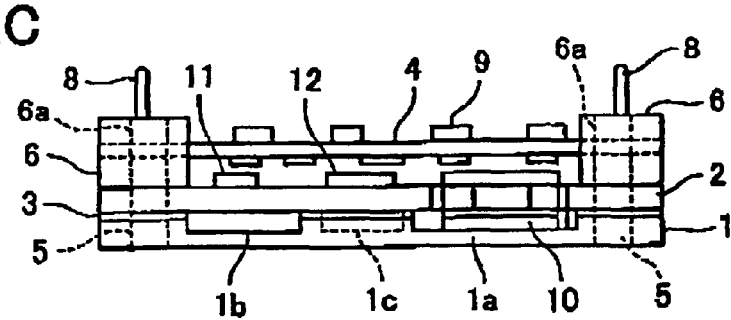
FIG. 2C is a front view of the electronic circuit board assembly shown in FIG. 2A.
Figure 2D:
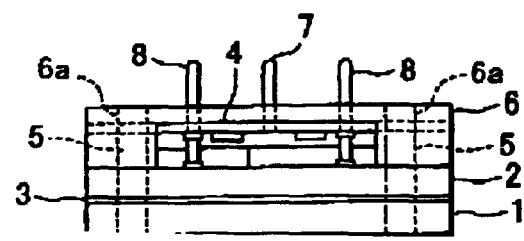
FIG. 2D is a right side view of the electronic circuit board assembly shown in FIG. 2A.

A preferred embodiment of the invention will be described with reference to the accompanying drawings. FIGS. 2A to 2D show a whole structure of an electronic circuit board assembly according to the embodiment of the present invention, in which FIG. 2A is a plan view: FIG. 2B is a bottom view; FIG. 2C is a front view; and FIG. 2D is a right side view of FIG. 2A.

In the following description, a switching power source will be taken as a desirable example for applying the heat dissipation structure according to the present invention. The switching power source includes DC—DC converter for converting a DC voltage to another DC voltage having a different level. Because power loss yields as a result of voltage conversion, heat generated due to the power loss needs to be dissipated. In recent years, the switching power sources are made compact in size while providing a higher level of power output, so that an increased amount of heat is generated locally from the switching power source. Therefore, a heat dissipation structure Is particularly needed to the switching power source. On the other hand, the switching power source is made up of a plurality of heat generating components different in shape and material as will be described later. Therefore, the heat dissipation structure has to collectively dissipate heat generated from the various components regardless of the shape and material of the components.

As is best shown in FIG. 2C, the electronic circuit assembly includes a heat dissipation board 1, a first circuit board 2, an insulation sheet 3, and a second circuit board 4. As described above, in this embodiment, the circuit boards 2 and 4 are mounted with electronic components that configure the switching power source. Mounted on the first circuit board 2 are power electronic components requiring heat dissipation, including power semi-conductor devices, such as a MOSFET (metallic oxide semi-conductor field effect transistor) and magnetic components, such as a transformer 12 and choke coils 10, 11 as shown in FIG. 2C. The second circuit board 4 is mounted chiefly with electronic components used for controlling purpose. As shown in FIG. 2C, the electronic components 9 are mounted on both top and bottom surfaces of the second circuit board 4. Heat dissipation is not essential for the components mounted on the second circuit board 4. The insulating sheet 3 is interposed between the first circuit board 2 and the heat dissipation board 1. The heat dissipation board 1 is formed with recessed portions 1a, 1b, and 1c in a surface facing the first circuit board 2 as will be described in detail hereinafter.

To assemble the heat dissipation board 1, the insulation sheet 3, the first and second circuit boards 2 and 4, four fixing rods 5 and a pair of plastic fixing members 6 are used. The heat dissipation board 1, the insulation sheet 3, the first and second circuit boards 2 and 4 are stacked one on the other in the stated order, and the fixing members 6 are placed over the first circuit board 2 at two opposing short sides thereof while bridging the second circuit board 4 between the pair of fixing members 6. Each fixing member 6 is formed with two holes 6a at both end portions thereof. The heat dissipation board 1, the insulation sheet 3, the first and second circuit boards 2 and 4 are also formed with holes corresponding to the holes 6a of the fixing members 6. The fixing rods 5 are force-fitted into the holes 6a while aligning the corresponding holes of the components to be assembled, whereby the insulating sheet 3 and the circuit boards 2 and 4 are sandwiched between the heat dissipation board 1 and the fixing members 6.

The circuit board assembly further includes first terminals 7 and second terminals 8. The first terminals 7 protrude from the fixing member 4, one from the right-side fixing member 4 and three from the left-side fixing member 4. The first terminals 7 penetrate into holes formed in the fixing members 6 to reach a land of the first circuit board 2. The end of each terminal 7 is fixed into a hole formed in the land of the first circuit board 4. The second terminals 8 also protrude from the fixing members 4, two from each fixing member. The second terminals 8 protrude to be the same height as the first terminals 7. The second terminals 8 penetrate into holes formed in the fixing members 6 to reach a land of the second circuit board 4. The end of each second terminal 8 is fixed into a hole formed in the land of the second circuit board 4. The second terminals 8 are each provided with two flange-like portions in a spaced-apart relation in the lenghtwise direction. The second circuit board 4 is supported by the upper flange-like portions of the second terminals 8. The lower flange-like portions of the second terminals 8 are in abutment with the surface of the first circuit board 2. The first and second circuit boards 2 and 4 are, therefore, spaced apart from each other by a predetermined distance corresponding to the distance between the upper and lower flange-like portions of the second terminals 8.

The lower portions of the fixing rods 5 are meshed to allow attachment of a case, a chassis, a frame or the like thereto. The meshed portions 5a of the fixing rods 5 can be accessed from the lower surface of the heat dissipation board 1.

Figure 3:
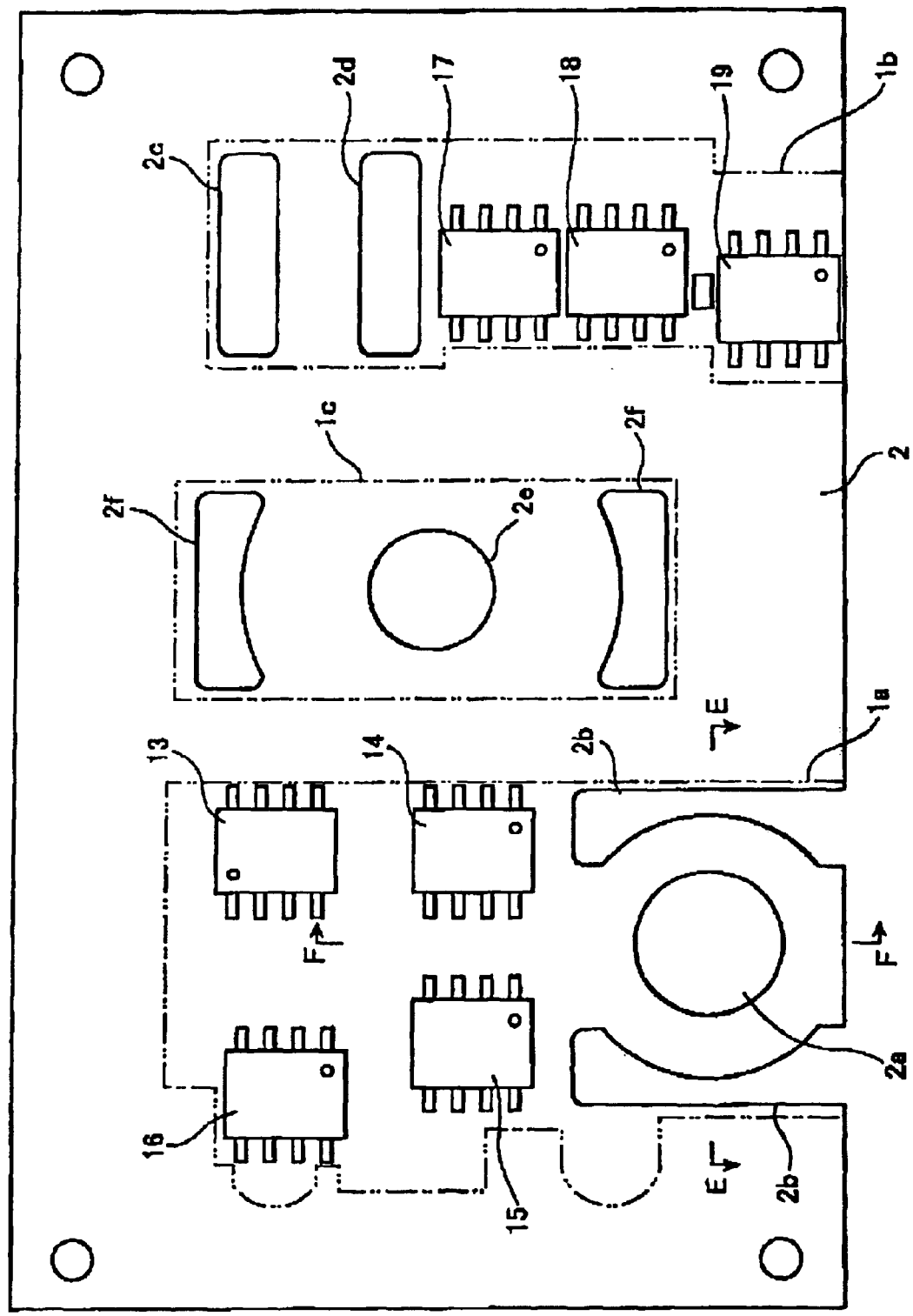
FIG. 3 is a bottom view of a printed-circuit board facing to a heat dissipation board according to the embodiment of the present invention.

FIG. 3 is a bottom view showing a layout of the electronic components protruding from the lower surface of the first circuit board 2, and notches (recessed portions) for the layout, where reference symbols 1a, 1b, 1e denote the portions corresponding to the recessed portions of the heat dissipation board 1. Reference symbols 2a and 2b denote a hole and a notch into which a central leg and side legs of the choke coil 10 are inserted, respectively. Further, reference numerals 13, 14, and 15 denote MOSFETs, and 16, an IC for driving these transistors. These electronic components are accommodated in the recessed portion 1a. The recessed portion 1a in which the above-noted electronic components are accommodated is filled with a resin for improving heat dissipation.

Reference symbols 2c and 2d denote holes into which cores of the choke coil 11 are inserted. Reference numerals 17, 18, and 19 denote MOSFETs, and these electronic components are accommodated in the recessed portion 1b. The MOSFETs are buried by the resin for improving heat dissipation. Reference symbols 2e and 2f denote through-holes into which a central leg and side legs of the transformer 12 are inserted, respectively. The transformer 12 is accommodated in the recessed portion 1c and is also buried by the resins.

Figure 4A:
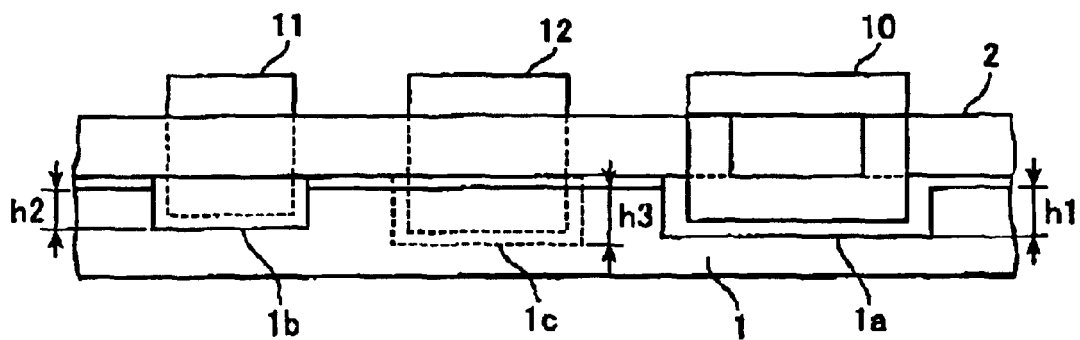
FIG. 4A is a front view explaining depths of recessed portions in the heat dissipation board according to the embodiment of the present invention.

FIG. 4A explains depths of the recessed portions 1a to 1c. The depths of these recessed portions 1a to 1c are set in accordance with protruding amounts of the MOSFETs 13 to 15 and the IC 16, the choke coil 11, and the transformer 12, respectively. To be more specific, when the first circuit board 2 is superposed on the heat dissipation board 1 with the insulating sheet 3 interposed therebetween, depths h1 to h3 of the recessed portions 1a to 1c are set so as to reserve substantially the same gap between the lower surfaces of those electronic components and bottom surfaces of the recessed portions 1a to 1c. Further, the recessed portion 1b is configured such that a series of depths of the portions in this recessed portion 1b, which correspond to the MOSFETS 13 to 15, the IC 16, and the choke coil 11, are made different from each other because of these electronic components having different protruding amounts.

Figure 4B:
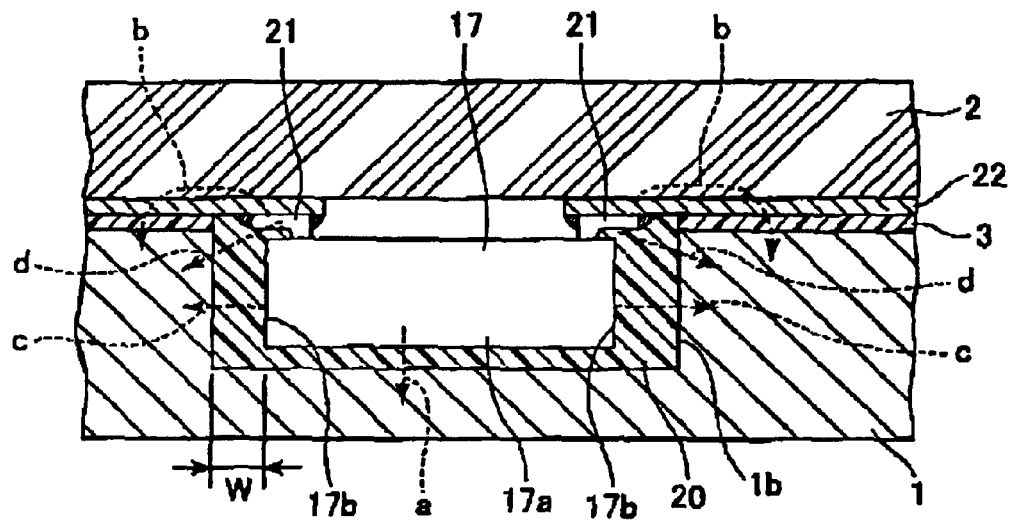
FIG. 4B is a cross-sectional view showing a structure of the heat dissipation board for mounting a MOSFET according to the embodiment of the present invention.

FIG. 4B is a sectional view showing a state where the MOSFET17 is fitted into the recessed portion 1b. The recessed portion 1b is filled with a gel-like resin 20 composed, for example, of silicon compound (silicon gel) exhibiting a high heat conductivity, and the MOSFET 17 is intruded into the recessed portion 1b filled with the resin 20. Thus, the MOSFET 17 is set in a state where a gap between the MOSFET 17 and an internal surface of the recessed portion 1b is filed with the resin 20. The other electronic components are similarly treated. In this case, the insulating sheet 3, which is a sheet formed of a silicon-group resin having a high thermal conductivity or a double-sided adhesive sheet, is interposed between the heat dissipation board 1 and the first circuit board 2, excluding the recessed portions 1a to 1c.

Thus, according to the structure in which the resin 20 fills the recessed portion 1b, the heat dissipation board 1 dissipates heat through the resin from a side surface 17b of the MOSFET 17 as indicated by an arrow c as well as from a bottom surface 17a of the MOSFET 17 as indicated by an arrow a, thereby improving heat dissipation capability. Further, the resin fills the gap between the side surface 17b of the MOSFET 17 and the internal surface of the recessed portion, and hence a distance W between these surfaces can be made proximate, whereby the high heat radiability from the side surface can be ensured.

Moreover, as in this example, in the case where the MOSFET 17 is a semiconductor device, the beat of a high-temperature terminal 21 is radiated through the resin between the MOSFET 17 and the internal surface of the recessed portion as indicated by an arrow d as well as through a wiring pattern 22 of the first circuit board 2 and through the insulating sheet 3 interposed between the first circuit board 2 and the heat dissipation board 1 as indicated by an arrow b. Thus, heat is dissipated with high efficiency.

Figure 4C:
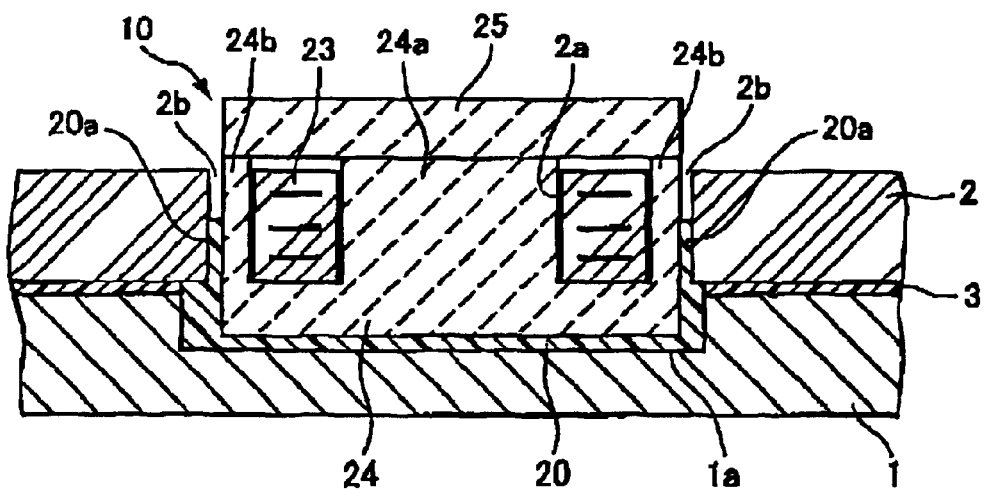
FIG. 4C is a cross-sectional view taken along the line E—E in FIG. 3, and shows a structure of the heat dissipation board for mounting a choke coil according to the embodiment of the present invention.

FIG. 4C is a cross-sectional view cut along the line E—E in FIG. 3, showing a structure for mounting the choke coil 10. According to the present invention, an insulator board or a metallic board coated with an insulator, in which no conductor is provided, may be used for each of the circuit boards 2 and 4. However, this embodiment exemplifies a case where the first circuit board 2 employs a composite board composed of a resin or a mixture of the resin and ceramic powders, which is comprised of a multi-layered board provided inside with conductors based on a laminate structure; and a coil conductor 23 configuring the choke coil 10 is provided based on the laminate structure within the circuit board 2. Reference numerals 24 and 25 denote cores configuring the choke coil 10. The core 24 is classified as an R-type core (that is a modified form of an E-type core, where a peripheral side leg 25b is formed in an arcuate shape). A central leg 24a of the core 24 penetrates the through-hole 2a, side legs 24b thereof penetrate the notches 2b, and the core 24 is thus bonded to the upper plate-like core 25.

As illustrated in FIG. 4C, in the case where the core 24 of the choke coil 10 is intruded into the recessed portion 1a, an extra resin 20a as a part of the resin 20 is filled in a gap formed due to the notch 2b, thereby preventing air bubbles from being generated and ensuring the thermal conductivity or the heat dissipation in the recessed portion 1a. Further, variation in the protruding amounts of the electronic components toward the heat dissipation board and variation in the dimensions of the recessed portions can be eliminated by providing an escaping area for the extra resin described above, with the result that a high dimensional accuracy in manufacturing and a high accuracy of the coating amount are not required of the device, which facilitates manufacturing processes.

It should be noted that, when the notch 2b is formed as a through-hole in this case, this can be ensured as the escaping area for the extra resin 20a. Moreover, the notch or the through-hole may be provided as one that does not receive the insertion of the core etc., i.e., as dedicated one for the escaping area for the resin.

Figure 5A:
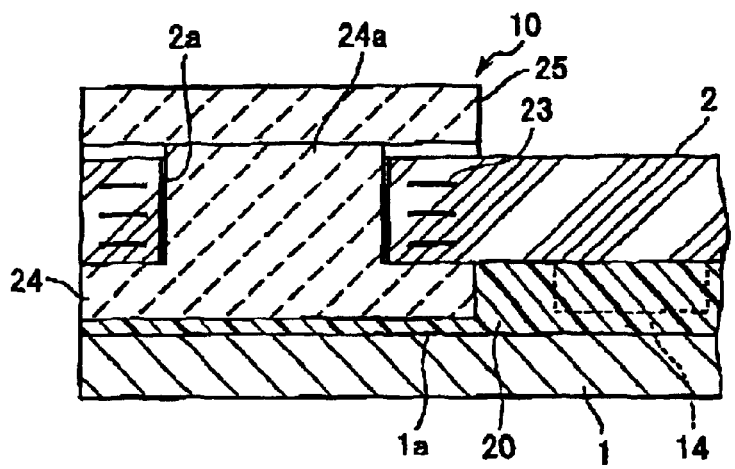
FIG. 5A is a cross-sectional view taken along the line F—F in FIG. 3, and shows a structure of the heat dissipation board for mounting the choke coil according to the embodiment of the present invention.

FIG. 5A is a cross-sectional view of a structure for mounting the choke coil 10 as viewed in a direction of a line F—F in FIG. 3. As illustrated in FIG. 5A, the recessed portion 1a is formed extending to the side surface from the surface of the heat dissipation board 1, and the choke coil 10 is mounted such that the side surface of the core 24 extends to the side surface of the heat dissipation board 1.

Figure 5B:
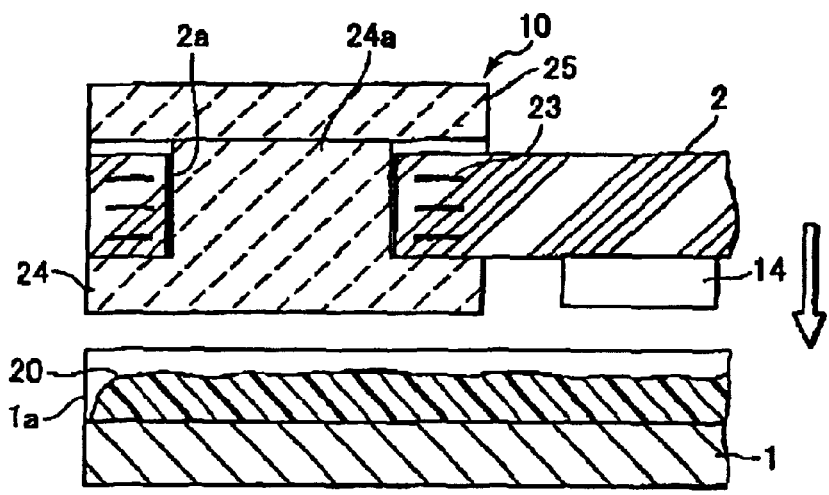
FIGS. 5B and 5C are explanatory views showing steps of assembling the choke coil into the recessed portions of the heat dissipation board.

FIGS. 4B and 4C are views showing steps of assembling the choke coil 10 of the circuit board 2 into the heat dissipation board 1. As shown in FIG. 5B, the recessed portion 1a is coated with the gel-like resin 20 exhibiting a satisfactory thermal conductivity. In this case, the amount of the resin 20 is set to such an amount that the resin 20 slightly overflows from the recessed portion 1a when the choke coil 10 is intruded into the recessed portion 1a.

Thereafter, the choke coil 10 mounted on the circuit board 2 is intruded into the resin 20 in the recessed portion 1a and is integrally superposed on the heat dissipation board 1 through the insulating sheet 3 exhibiting the high thermal conductivity, portions of which correspond to the recessed portions 1a to 1c are removed. Therefore, a gap between the periphery of the choke coil 10 and the internal surface of the recessed portion 1a is filled with the resin 20.

Figure 5C:
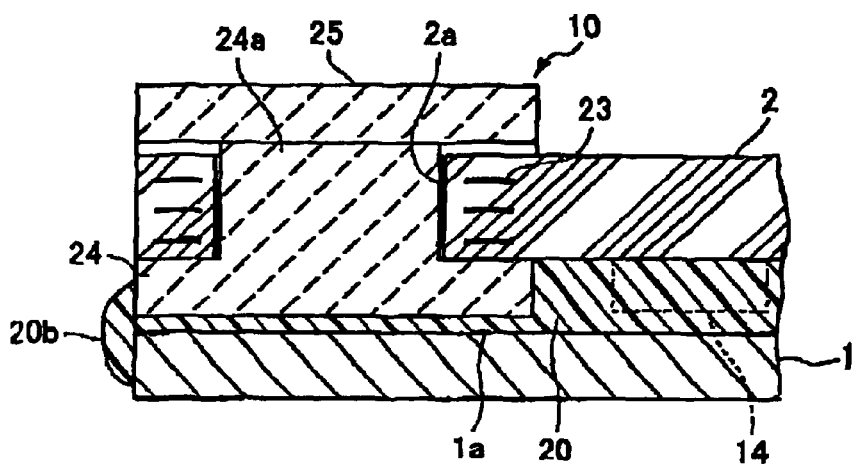

Through such a step, as shown in FIG. 5C, a partial resin 20b of the resin 20 is swollen out of the side surface of the heat dissipation board 1 and thereafter the extra resin 20b swelling out of the side surface thereof is removed by wiping. Note that an unillustrated tape is pasted to the portion thus exposed from the side surface.

Through such a step, the electronic components, such as the choke coil 10, can be intruded in the state where the resin 20 is sufficiently coated over the recessed portion 1a, thereby making it possible to prevent the air bubbles from being generated and to ensure the thermal conductivity in the resin. Further, a space for accommodating the electronic components, such as the choke coil 10, is enlarged enough to increase a degree of freedom of mounting the electronic components, thereby attaining a higher density of mounting the electronic components on the circuit board 2.

Furthermore, the electronic components, such as the choke coil 10, are mounted so that the side surfaces thereof extend to the side surface of the heat dissipation board 1, whereby the high-density mounting is attained. At the same time, cooling air blows directly against the electronic components when effecting forcible air cooling, whereby a heat radiating effect rises.

What is claimed is:

1. An electronic circuit board assembly comprising:
   an electronic circuit board on which a plurality of electronic components are mounted;
   an electrical insulation sheet; and
   a heat dissipation board in facial contact with the electronic circuit board with the electrical insulation sheet interposed therebetween, the heat dissipation board being formed with at least one recessed portion on a top surface facing the electronic circuit board and having side surfaces connecting to the top surface, the recessed portion having side walls and a bottom wall, wherein a heat dissipation material is coated over the recessed portion and at least one electronic component from the plurality of electronic components is accommodated in the recessed portion over which the heat dissipation material is coated, wherein the heat dissipation material fills a gap between the electronic component and the side walls and the bottom wall of the recessed portion, wherein the recessed portion formed in the heat dissipation board extends to at least one of the side surfaces of the heat dissipation board and the heat dissipation material is filled over an area covering the one of the side surfaces of the heat dissipation board.

2. The electronic circuit board assembly according to claim 1, wherein the heat dissipation board is formed with a plurality of recessed portions on the top surface facing the electronic circuit board, at least two recess portions from the plurality of recessed portions having different depths.

3. The electronic circuit board assembly according to claim 2, wherein the depth of each of the plurality of recessed portions is determined depending on a height of the electronic component to be accommodated.

4. The electronic circuit board assembly according to claim 3, wherein at least two electronic components from the plurality of electronic components mounted on the electronic circuit board are accommodated in at least one of the plurality of recessed portions.

5. The electronic circuit board assembly according to claim 3, wherein a single electronic component from the plurality of electronic components mounted on the electronic circuit board is accommodated in at least one of the plurality of recessed portions.

6. An electronic circuit board assembly comprising:
   an electronic circuit board on which a plurality of electronic components are mounted;
   an electrical insulation sheet; and
   a heat dissipation board in facial contact with the electronic circuit board with the electrical insulation sheet interposed therebetween, the heat dissipation board being formed with at least one recessed portion on a top surface facing the electronic circuit board and having side surfaces connecting to the top surface, the recessed portion having side walls and a bottom wall, wherein a heat dissipation material is coated over the recessed portion and at least one electronic component from the plurality of electronic components is accommodated in the recessed portion over which the heat dissipation material is coated, wherein the heat dissipation material fills a gap between the electronic component and the side walls and the bottom wall of the recessed portion, wherein at least one of a through-hole and a notch is formed in the electronic circuit board to allow the heat dissipation material to escape from the recessed portion when the electrical component is intruded into the recessed portion.

7. The electronic circuit board assembly according to claim 1, wherein the electronic component is mounted on the electronic circuit board to be in alignment with the one of the side surfaces of the heat dissipation board.

8. The electronic circuit board assembly according to claim 1, wherein the plurality of electronic components mounted on the electronic circuit board includes a choke coil, MOS-FET, an IC driver for driving the MOS-FET, and a transformer to configure a switching power source including a DC-to-DC converter.

9. The electronic circuit board assembly according to claim 1, wherein the heat dissipation material is made from a gel-like resin.

10. An electronic circuit board assembly comprising:
    a first electronic circuit board on which a plurality of heat generating electronic components are mounted;
    a second electronic circuit board on which a plurality of electronic components are mounted, the first electronic circuit board and the second electronic circuit board being positioned in spaced apart relation from each other;
    an electrical insulation sheet; and
    a heat dissipation board in facial contact with the first electronic circuit board with the electrical insulation sheet interposed therebetween, the heat dissipation board being formed with at least one recessed portion on a top surface facing the first electronic circuit board and having side surfaces connecting to the top surface, the recessed portion having side walls and a bottom wall, wherein a heat dissipation material is coated over the recessed portion and at least one heat generating electronic component from the plurality of heat generating electronic components is accommodated in the recessed portion over which the heat dissipation material is coated, wherein the heat dissipation material fills a gap between the heat generating electronic component and the side walls and the bottom wall of the recessed portion.

11. The electronic circuit board assembly according to claim 10, wherein the heat dissipation board is formed with a plurality of recessed portions on the top surface facing the electronic circuit board, at least two recess portions from the plurality of recessed portions having different depths.

12. The electronic circuit board assembly according to claim 11, wherein the depth of each of the plurality of recessed portions is determined depending on a height of the heat generating electronic component to be accommodated.

13. The electronic circuit board assembly according to claim 12, wherein at least two heat generating electronic components from the plurality of heat generating electronic components mounted on the electronic circuit board are accommodated in at least one of the plurality of recessed portions.

14. The electronic circuit board assembly according to claim 12, wherein a single heat generating electronic component from the plurality of heat generating electronic components mounted on the electronic circuit board is accommodated in at least one of the plurality of recessed portions.

15. The electronic circuit board assembly according to claim 10, wherein at least one of a through-hole and a notch is formed in the electronic circuit board to allow the heat dissipation material to escape from the recessed portion when the heat generating electrical component is intruded into the recessed portion.

16. The electronic circuit board assembly according to claim 10, wherein the recessed portion formed in the heat dissipation board extends to at least one of the side surfaces of the heat dissipation board and the heat dissipation material is filled over an area covering the one of the side surfaces of the heat dissipation board.

17. The electronic circuit board assembly according to claim 16, wherein the heat generating electronic component is mounted on the first electronic circuit board to be in alignment with the one of the side surfaces of the heat dissipation board.

18. The electronic circuit board assembly according to claim 10, wherein the plurality of heat generating electronic components mounted on the first electronic circuit board and the plurality of electronic components mounted on the second electronic circuit board configure a switching power source including a DC-to-DC converter.

19. The electronic circuit board assembly according to claim 10, wherein the heat dissipation material is made from a gel-like resin.

20. A method of manufacturing an electronic circuit board assembly including an electronic circuit board on which a plurality of electronic components are mounted, an electrical insulation sheet, and a heat dissipation board having a top surface and side surfaces connecting to the top surface, the method comprising:

forming a recessed portion in the top surface of the heat dissipation board to extend to at least one of the side surfaces, the recessed portion having side surfaces and a bottom surface;

coating the recessed portion with a gel-like resin having heat dissipation capability;

bringing the electronic circuit board into facial contact with the heat dissipation board with the electrical insulation sheet interposed therebetween so that at least one electronic component from the plurality of electronic components mounted on the electronic circuit board is buried in the gel-like resin, wherein the gel-like resin coated in the recessed portion being such an amount that a gap between the electronic component and side surfaces and bottom surface of the recessed portion is filled with the gel-like resin and an excess amount of the gel-like resin is expelled out of the one of the side surfaces of the heat dissipation board; and removing the gel-like resin protruded from the at least one of the side surfaces of the heat dissipation board.

* * * * *